United States Patent [19]

Yamamoto et al.

[11] Patent Number: 5,452,312
[45] Date of Patent: Sep. 19, 1995

[54] SHORT-WAVELENGTH LASER LIGHT SOURCE AND OPTICAL INFORMATION PROCESSING APARATUS

[75] Inventors: Kazuhisa Yamamoto, Takatsuki; Kiminori Mizuuchi, Neyagawa; Yasuo Kitaoka, Kawachinagano; Makoto Kato, Nishinomiya, all of Japan

[73] Assignee: Matsushita Electric Industrial Co., Ltd., Kadoma, Japan

[21] Appl. No.: 322,190

[22] Filed: Oct. 12, 1994

[30] Foreign Application Priority Data

Oct. 18, 1993 [JP] Japan .................. 5-259646

[51] Int. Cl.⁶ .......................................... H01S 3/30
[52] U.S. Cl. ................................. 372/5; 372/22; 372/21; 372/108; 372/102
[58] Field of Search ............. 372/21, 22, 5, 108, 372/102, 99, 92

[56] References Cited

U.S. PATENT DOCUMENTS

| | | | |
|---|---|---|---|
| 5,128,948 | 7/1992 | Papuchon et al. | 372/21 |
| 5,205,904 | 4/1993 | Yamamoto et al. | 156/664 |
| 5,249,191 | 9/1993 | Sawaki et al. | 372/21 |
| 5,303,247 | 4/1994 | Yamamoto et al. | 372/22 |

FOREIGN PATENT DOCUMENTS 4-54210  8/1992  Japan .

OTHER PUBLICATIONS

Yamamoto et al., IEEE Photonics Technology Letters, vol. 4, No. 5. pp. 435–437 (May 1992), "Blue—Light Generation by Frequency Doubling of a Laser Diode in a Periodically Domain Inverted LitaO₃Waveguide".

Primary Examiner—Leon Scott, Jr.
Attorney, Agent, or Firm—Renner, Otto, Boisselle & Sklar

[57] ABSTRACT

A short-wavelength laser light source having a semiconductor laser for emitting laser light is provided. The light source includes a power supply for driving the semiconductor laser and thereby causing the semiconductor laser to emit a fundamental wave, a polarization inversion-type light-wavelength converting device for generating from the fundamental wave a harmonic wave having a shorter wavelength than the fundamental wave; and laser light feedback means for feeding light of the fundamental wave lying in a selected wavelength region back to the semiconductor laser, thereby achieving oscillation wavelength locking. Said power supply supplies to the semiconductor laser a high-frequency power containing AC components oscillating in a cycle short enough to cause the semiconductor laser to emit the fundamental wave in the form of pulsed laser light.

24 Claims, 15 Drawing Sheets

SHORT-WAVELENGTH LASER LIGHT SOURCE AND OPTICAL INFORMATION PROCESSING APARATUS

BACKGROUND OF THE INVENTION

1. Field of the Invention

The present invention relates to a short-wavelength laser light source and an optical information processing apparatus used for optical information processing, optics-applied measurement control, or optical communication where coherent light is used.

2. Description of the Related Art

In the field of optical information processing, a 10 mW or larger output power is required for the short-wavelength laser light source used for optical recording. A combination of a semiconductor laser and a light-wavelength converting device capable of generating a harmonic of the laser light (i.e., an optical frequency doubler) shows promise as a blue laser light source. FIG. 13 shows the construction of a blue-light emitting, short-wavelength laser light source of the related art. A fundamental wave P1 emitted from a semiconductor laser 21 is first collimated by a collimator lens 24, and then focused by a focusing lens 25 onto an optical waveguide 2 formed in a light-wavelength converting device 22. The fundamental wave is passed through the optical waveguide 2 for conversion into a harmonic wave P2 which is output. Part of the output harmonic wave P2 is deflected 90 degrees by a beam splitter 26 and detected by a detector 27, by which the semiconductor laser 21 is controlled in order to maintain a constant output. In this manner, a constant harmonic wave P2 is output.

Next, the light-wavelength converting device used in the above arrangement will be described in detail. FIG. 14 shows the construction of the light-wavelength converting device of the related art. The following describes in detail the generation of a harmonic wave (wavelength 437 nm) from a fundamental wave of 873-nm wavelength with reference to the accompanying drawings. (Refer to Kazuhisa Yamamoto and Kiminori Mizuuchi, "Blue light generation by frequency doubling of a laser diode in a periodically-domain inverted LiTaO3 waveguide," IEEE Photonics Technology Letters, Vol. 4, No. 5, pp. 435–437, 1992.) As shown in FIG. 14, the optical waveguide 2 is formed in an LiTaO3 substrate 1, and layers 3 with periodic inversion of polarization (polarization inversion layers) are formed in the optical waveguide 2. The polarization inversion layers (i.e., domain-inverted regions) 3 are periodically interleaved with polarization non-inversion layers 4 to compensate for the propagation constant mismatch between the fundamental wave and the generated harmonic wave so as to increase the efficiency of harmonic generation. First, the principle of harmonic amplification in the light-wavelength converting device will be described with reference to FIG. 15. In a polarization non-inversion device 31 with no polarization inversion, no polarization inversion layers are formed and the polarizations are oriented in the same direction. In this polarization non-inversion device 31, a harmonic output 31a just repeats increasing and decreasing along the direction of propagation through the optical waveguide. On the other hand, in the case of a polarization inversion wavelength converting device (first-order cycle) 32 with periodic inversion of polarization, the harmonic output, designated as an output 32a in FIG. 15, increases with the square of the length L of the optical waveguide as shown. However, in the polarization inversion device the harmonic output P2 is obtained from the fundamental input P1 only when pseudo phase matching is achieved. This pseudo phase matching is achieved only when the interval $\Lambda 1$ of the polarization inversion layers coincides with $\lambda/(2(N2\omega - N\omega))$, where $N\omega$ is the effective refractive index for the fundamental wave (wavelength $\lambda$) and $N2\omega$ is the effective refractive index for the harmonic wave (wavelength $\lambda/2$). In this manner, the light-wavelength converting device of the related art is based on the polarization inversion structure.

A fabrication method for this device will be described below. A pattern of Ta repeating at intervals of a few micrometers in width is formed by deposition and photolithography on the LiTaO3 substrate 1, a nonlinear optical crystal. Next, proton exchange is performed at a temperature of 260° C., which is followed by heat treatment at about 550° C. to form polarization inversion layers 3 of opposite polarization to that of the LiTaO3 substrate 1. A slit is formed again from Ta, after which heat treatment is performed with pyrophosphorous acid (260° C.) for 12 minutes, followed by annealing at 420° C. for one minute. The result is the formation of the optical waveguide 2. With the thus fabricated light-wavelength converting device, a power of 1.1 mW was obtained for the harmonic wave P2 generated from the fundamental wave P1 of 873-nm wavelength when the length of the optical waveguide was set at 10 mm and the power of the fundamental wave P1 at 37 mW. Furthermore, the above light-wavelength converting device had an allowable width of as narrow as 0.1 nm for the fundamental wave, and did not allow mode hopping or wavelength spread of the semiconductor laser.

In the short-wavelength laser light source based on the above semiconductor laser, operation with a power higher than 100 mW is difficult when the reliability of the semiconductor laser is considered; furthermore, when the lens loss and the optical waveguide coupling loss are considered, the available fundamental output is about 50 to 70 mW. Consequently, the harmonic output that can be obtained is only 2 to 4 mW, and therefore, it is difficult with the above device to obtain a consistently harmonic output of over 10 mW which is the practical level of a short-wavelength laser in the field of optical information processing.

SUMMARY OF THE INVENTION

The short-wavelength laser light source of the present invention comprises:

at least one semiconductor laser for emitting laser light;

a power supply for driving the semiconductor laser and thereby causing the semiconductor laser to emit a fundamental wave;

a polarization inversion-type light-wavelength converting device for generating from the fundamental wave a harmonic wave having a shorter wavelength than the fundamental wave; and laser light feedback means for feeding light of the fundamental wave lying in a selected wavelength region back to the semiconductor laser, thereby achieving oscillation wavelength locking, wherein the power supply supplies to the semiconductor laser a high-frequency power containing AC components oscillating in a cycle short enough to cause the semiconductor laser to emit the fundamental wave in the form of pulsed laser light.

In one embodiment, the pulse duration of the pulsed laser light is less than or equal to one-tenth of the cycle.

In one embodiment, the high-frequency power is 500 megahertz or higher in frequency.

In one embodiment, the high-frequency power is 1 W or larger in power.

In one embodiment, the light-wavelength converting device comprises
a substrate having a nonlinear optical effect, and
a polarization inversion layer formed in the substrate.

In one embodiment, the substrate having a nonlinear optical effect is an $LiNb_xTa_{1-x}O_3$ substrate ($0 \leq x \leq 1$).

In one embodiment, the light-wavelength converting device comprises
a substrate having a nonlinear optical effect,
an optical waveguide, formed in the substrate, for guiding laser light, and
a polarization inversion layer formed in the substrate.

In one embodiment, the substrate having a nonlinear optical effect is an $LiNb_xTa_{1-x}O_3$ substrate ($0 \leq x \leq 1$).

In one embodiment, the laser light feedback means includes a grating for diffracting the light lying in the selected wavelength region in a designated direction.

In one embodiment, the laser light feedback means includes a grating for diffracting the light lying in the selected wavelength region in a designated direction, the grating being formed on the optical waveguide of the light-wavelength converting device.

In one embodiment, the laser light feedback means includes a wavelength selective filter for transmitting the light lying in the selected wavelength region, and reflecting means for reflecting the light transmitted through the wavelength selective filter back to the semiconductor laser.

In one embodiment, the wavelength selective filter is mounted between the semiconductor laser and the light-wavelength converting device.

In one embodiment, the reflecting means is a fundamental wave incident face or harmonic wave emergent face of the light-wavelength converting device.

In one embodiment, the light source further comprises
a first lens for collimating the fundamental wave emitted from the semiconductor laser, and
a second lens for converging the collimated fundamental wave onto the light-wavelength converting device,
wherein the wavelength selective filter is mounted between the first lens and the second lens.

In one embodiment, the laser light feedback means is a wavelength selective reflecting mirror that reflects the light lying in the selected wavelength region.

In one embodiment, the wavelength selective reflecting mirror is mounted between the semiconductor laser and the light-wavelength converting device.

In one embodiment, the wavelength selective reflecting mirror is mounted on the light-wavelength converting device.

In one embodiment, the semiconductor laser and the light-wavelength converting device are integrated on a submount and are optically coupled directly to each other.

In one embodiment, the spacing between the semiconductor laser and the grating is within 9 mm.

In one embodiment, the reflectance at an end of the semiconductor laser from which the fundamental wave emerges is within a range of 0.5 to 2.5%.

The short-wavelength laser light source of the present invention comprises:
at least one semiconductor laser for emitting laser light;
a DC power supply for driving the semiconductor laser and thereby causing the semiconductor laser to emit a fundamental wave;
a polarization inversion-type light-wavelength converting device for generating from the fundamental wave a harmonic wave having a shorter wavelength than the fundamental wave; and
laser light feedback means for feeding light of the fundamental wave lying in a selected wavelength region back to the semiconductor laser, thereby achieving oscillation wavelength locking,
wherein the light-wavelength converting device comprises:
a substrate having a nonlinear optical effect;
an optical waveguide, formed in the substrate, for guiding laser light;
a polarization inversion layer formed in the substrate; and
a modulation electrode, formed on the optical waveguide, for controlling the propagation of the laser light,
the modulation electrode being used to modulate the feedback to the semiconductor laser of the light lying in the selected wavelength region in accordance with a pulse-like modulation voltage.

Thus, the invention described herein makes possible the advantage of providing a compact laser light source, based on a semiconductor laser, capable of producing high-output, short-wavelength light.

This and other advantages of the present invention will become apparent to those skilled in the art upon reading and understanding the following detailed description with reference to the accompanying figures.

DESCRIPTION OF THE PREFERRED EMBODIMENTS

Figure 1:
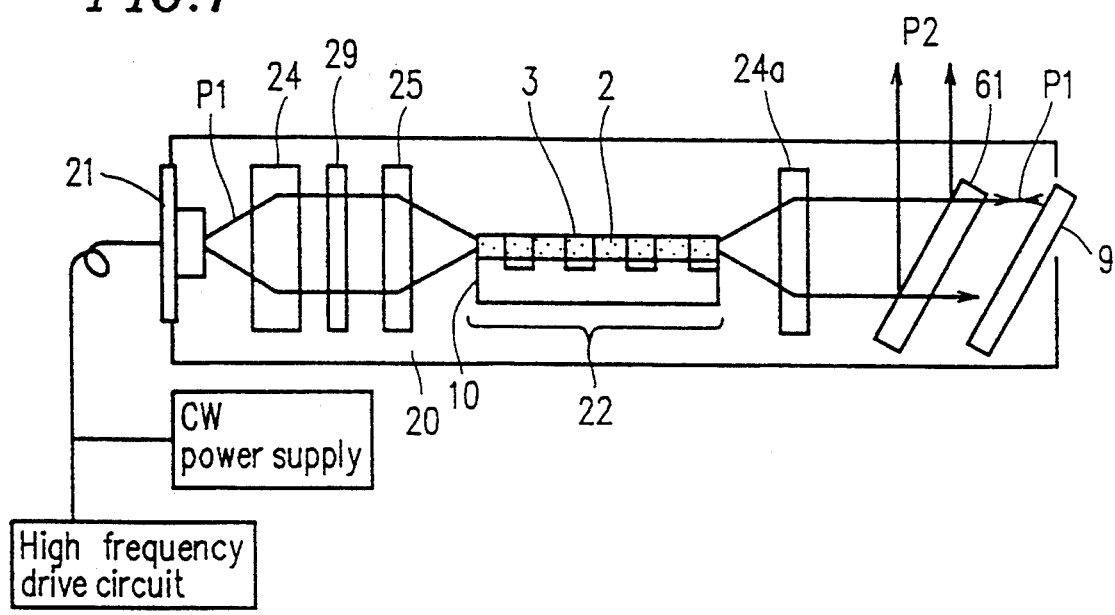
FIG. 1 is a diagram showing the construction of a short-wavelength laser light source according to a first embodiment of the invention.

According to the present invention, a semiconductor laser that generates a fundamental wave is driven by a high-frequency power for pulsed operation with relaxation oscillations. This makes it possible to greatly increase the peak power of the fundamental wave without increasing the average power of the emitted fundamental wave. As a result, the harmonic conversion efficiency of the light-wavelength converting device is increased, and a drastic increase in the average power of the harmonic output can be achieved. According to the invention, the oscillation wavelength of the semiconductor laser is kept constant, regardless of changes in temperature and current, by feedback from the grating formed on the optical waveguide.

First, how the harmonic output can be drastically increased will be explained. When the semiconductor laser is driven by a high-frequency power of 100 MHz and over, relaxation oscillation occurs, producing a fundamental wave in the form of a sharply rising pulse. Since the efficiency of harmonic conversion increases in proportion to the output power of the incident fundamental wave, the conversion efficiency with this pulse-like fundamental wave is very high. On the other hand, since the lifetime of the semiconductor laser is determined by the average power of the fundamental wave that the laser outputs, generating a fundamental wave with a narrow pulse width and a high peak power does not affect the lifetime. As a result, a harmonic with a high peak pulse is obtained, and the efficiency greatly increases with increased average output power. However, since the applied current changes suddenly, wavelength spread results. More specifically, the wavelength spread is 5 to 10 nm which is more than 50 times the allowable width for SHG.

Next, how a constant single wavelength can be obtained according to the invention will be explained. When the drive current of the semiconductor laser changes, the refractive index of the semiconductor laser material also changes. In response to this change, the oscillation wavelength tries to change, but since the wavelength being fed back from the grating is constant, oscillation continues at that constant wavelength. That is, the oscillation wavelength $\lambda$ is given as $\lambda=2N\Lambda$, where $\Lambda$ is the grating interval and N is the refractive index of the optical waveguide. Since the interval $\Lambda$ and the refractive index N are constant, the oscillation wavelength $\lambda$ is also constant. As a result, a constant single wavelength is obtained in pulsed operation, thus satisfying the allowable wavelength width of the light-wavelength converting device.

When an optical transmitting filter is used, only a specific wavelength is transmitted, and the transmitted wavelength is fed back to the semiconductor laser by means of a reflecting face located at a confocal point. The oscillation of the semiconductor laser is locked at this specific wavelength. Other wavelengths of reflected light are not fed back to the semiconductor laser since the transmitting filter is mounted at an angle. This is why wavelength spread does not occur when the transmitting filter is used. The same is true for the construction using a reflecting mirror.

A constant-width single spectrum is obtained in this manner, and by combining a phase matching waveform with it, a stable, high-power harmonic output can be obtained.

With reference to the accompanying drawings, the preferred embodiments of the invention will be described as below.

Embodiment 1

A first embodiment of the short-wavelength laser light source of the present invention will be described with reference to the drawings. FIG. 1 shows the construction of a blue laser light source constructed using a light-wavelength converting device. The blue laser light source shown includes: a light-wavelength converting device 22 formed from a substrate having a nonlinear optical effect and in which an optical waveguide 2 and regularly repeating polarization inversion layers 3 are formed; a semiconductor laser 21; and a high-frequency power supply for driving the semiconductor laser 21.

During the fabrication, the light-wavelength converting device 22 was bonded to mount 20 first, and then a focusing lens 25 with an NA of 0.5 and a half-wave plate 29 were inserted in the mount 20 and fixed in place. Next, a collimator lens 24 with an NA of 0.3 and the semiconductor laser 21 were inserted, and while driving the semiconductor laser 21, the collimator lens 24 and the semiconductor laser 21 were moved so that the fundamental wave P1 was focused on an incident face 10 of the light-wavelength converting device 22 to maximize the harmonic wave output P2, and were then fixed in place. After that, a wavelength selective mirror 61 designed to transmit the fundamental wave P1 and to reflect the harmonic wave P2 emerging from the optical waveguide 2 was fitted to the mount 20. Next, a grating 9 with a pitch of 0.55 $\mu$m was installed.

In FIG. 1, the semiconductor laser 21 operates at an oscillation wavelength of 0.86 $\mu$m, and emits a fundamental wave P1 with an average power of 100 mW by being supplied with a constant current (hereinafter called the DC bias) from a CW power supply and a sinusoidal high-frequency wave (1 GHz) from the high-frequency power supply. This fundamental wave P1 is passed through the lenses 24, 25 and half-wave plate 29, and introduced into the light-wavelength converting device 22 for the generation of the harmonic wave P2. The half-wave plate 29 is inserted in order to make the direction of polarization of the semiconductor laser 21 coincide with that of the optical waveguide 2 formed in the light-wavelength converting device 22 of 10-mm in length. With this light-wavelength converting device 22, when a fundamental wave P1 of 50 mW was introduced into the optical waveguide 2, a harmonic output of 12 mW was obtained, the total conversion efficiency being 24%. The stability of the harmonic output was within ±1%.

Figure 2A:
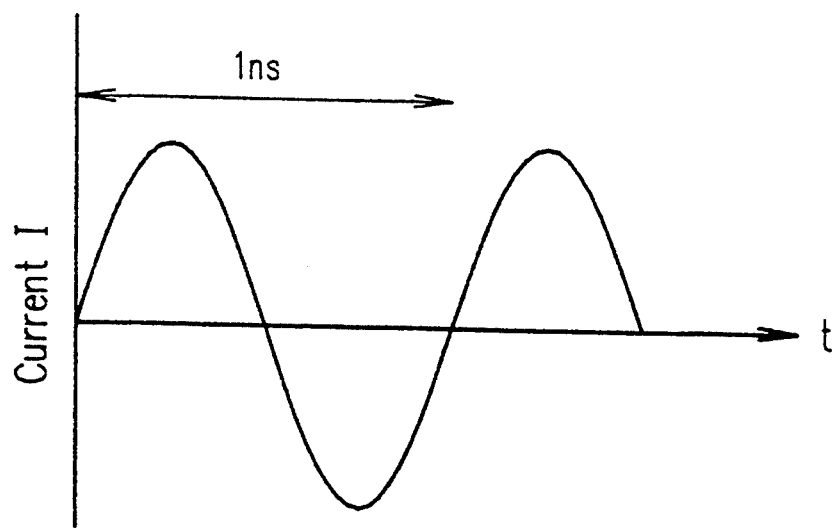
FIG. 2A is a diagram showing an electrical waveform applied to a semiconductor laser.
Figure 2B:
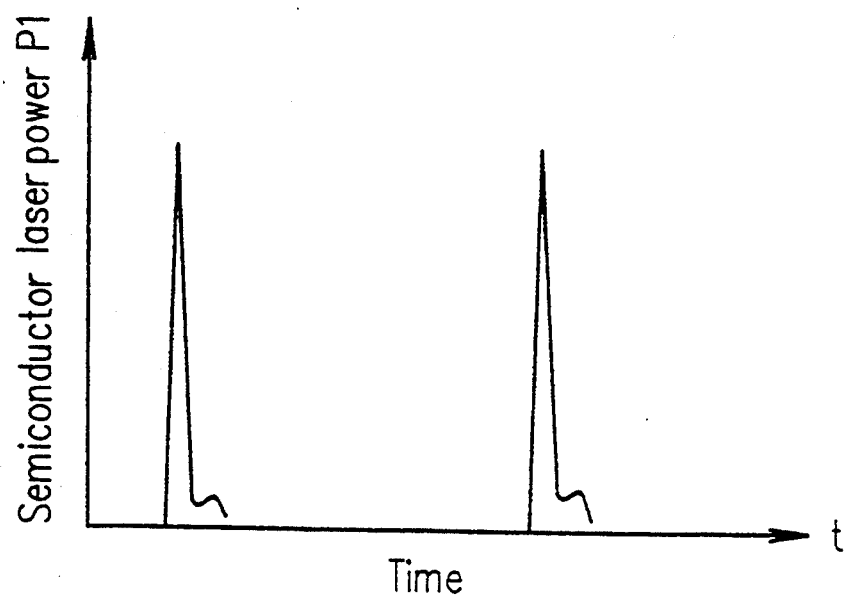
FIG. 2B is a diagram showing a semiconductor laser output waveform applied to the semiconductor laser.

The electrical waveform supplied from the high-frequency power supply and the fundamental waveform of the emission from the semiconductor laser 21 driven by the high-frequency power are shown in FIGS. 2A and 2B, respectively. During operation, the semiconductor laser 21 is not fast enough to respond to the change of the electrical waveform (FIG. 2A), and produces sudden pulses with relaxation oscillations (FIG. 2B). At this time, the peak output of the semiconductor laser 21 is about 1 W, and the harmonic conversion efficiency is higher than 20%. In this case, the average power of the semiconductor laser 21 is 100 mW, which in itself does not cause a reliability problem. The power of the harmonic output after conversion was increased by a factor of 5 to 10 compared with that obtained in CW operation.

Figure 3:
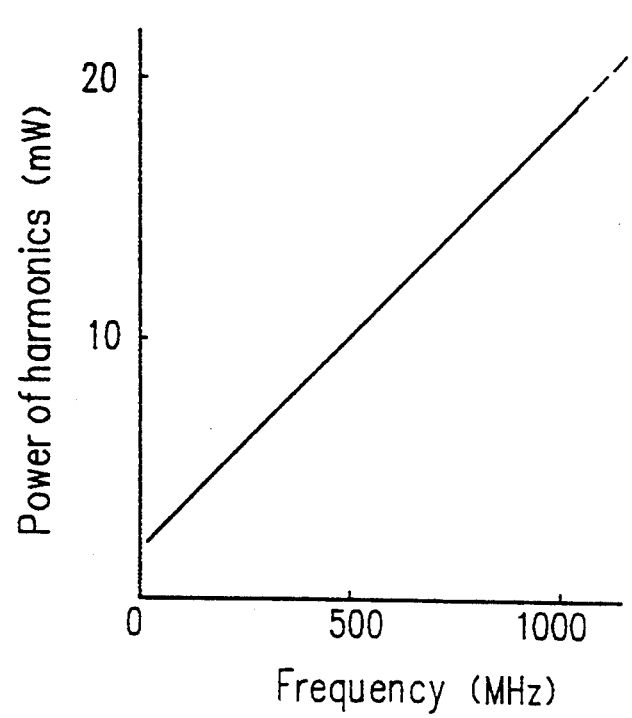
FIG. 3 is a characteristic diagram showing the dependence of a harmonic output on a drive frequency.

FIG. 3 shows the relationship between the drive frequency and the harmonic output power when the average power of the semiconductor laser 21 is 100 mW. In the frequency range shown, the harmonic output power increases linearly with the drive frequency, achieving higher efficiencies at higher frequencies. The reason for this is believed to be that the half-value width of the pulse waveform of the semiconductor laser is narrowed as the frequency increases.

Figure 4A:
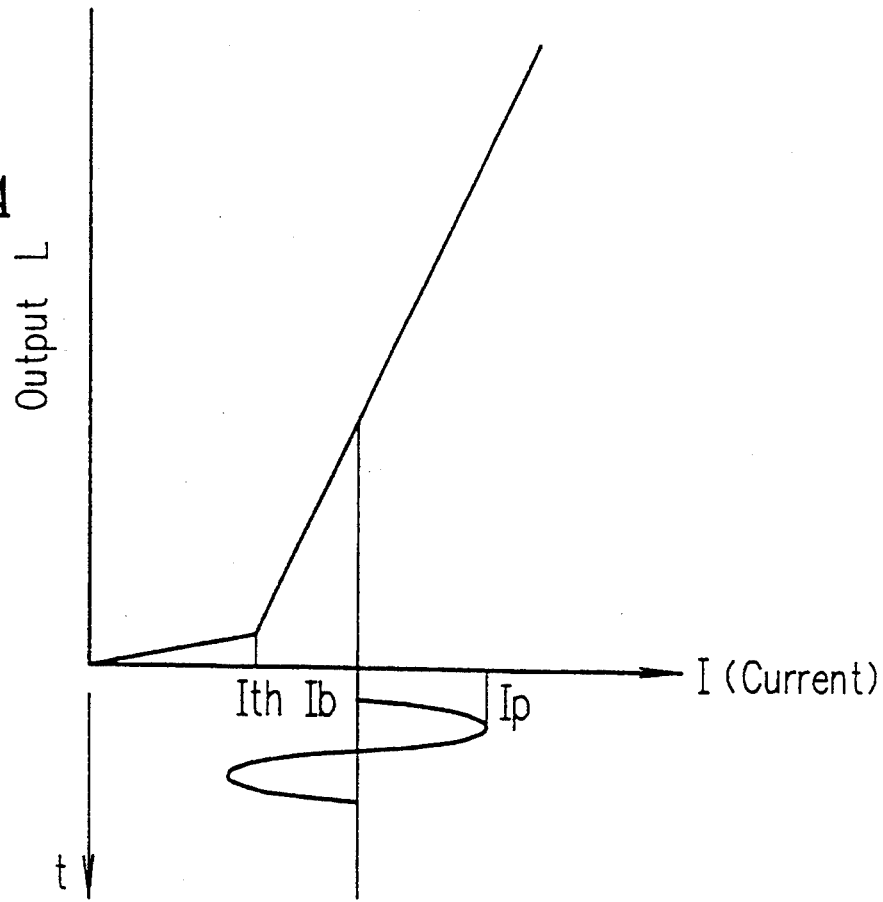
FIG. 4A is a diagram showing the I-L characteristic of the semiconductor laser when the difference ($I_p - I_b$) between peak current $I_p$ and operating current $I_b$ is about two times ($I_b - I_{th}$)
Figure 4B:
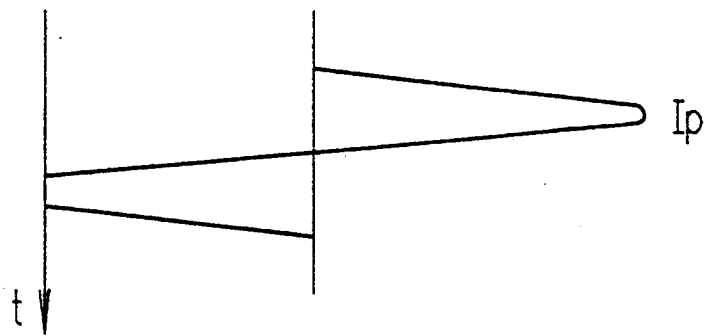
FIG. 4B is a diagram showing the I-L characteristic of the semiconductor laser when the difference ($I_p - I_b$) between peak current $I_p$ and operating current $I_b$ is about five times ($I_b - I_{th}$).

FIGS. 4A and 4B show the I-L characteristics (current-output characteristics) of the semiconductor laser for explaining the difference in driving method between the high-frequency driving of the invention and conventional high-frequency superposition. High-frequency superposition is used simply for the purpose of stabilizing the semiconductor laser, so that the minimum value of the current is set at a value slightly below the threshold Ith for semiconductor laser oscillation. That is, as shown in FIG. 4A, the difference $(I_p - I_b)$ between the peak current $I_p$ and the operating current $I_b$ is at most twice the difference $(I_b - I_{th})$ between the operating current and the threshold current. On the other hand, in high-frequency driving the purpose of which is to increase the peak power of the semiconductor laser, $(I_p - I_b)$ is at least three times $(I_b - I_{th})$, and usually 5 to 10 times the difference. The increase of the peak power is particularly noticeable when the high-frequency driving power is 1 W or higher. Furthermore, a higher peak power is obtained when a DC bias is applied than when it is not applied.

In this embodiment, the pulse width (duration) of the fundamental wave is as narrow as 30 ps, which is about 1/30 of the repetition period (1 ns) of the driving high frequency. The pulse width should preferably be 1/10 or less of the repetition period. If it exceeds 1/10 of the repetition period, it is difficult to obtain a sharp peak output and a substantial increase in the conversion efficiency cannot be achieved.

When high-frequency driving was employed to drive the semiconductor laser, we were able to suppress the variation of the harmonic output within ±1%. This is because oscillation occurs stably at a single wavelength since light is fed back into the semiconductor laser 21 by the grating 9, despite the oscillation wavelength of the semiconductor laser 21 tending to be spread by high-frequency driving.

Embodiment 2

The construction of a second embodiment of the laser light source of the invention will be described below with reference to the drawings.

Figure 5:
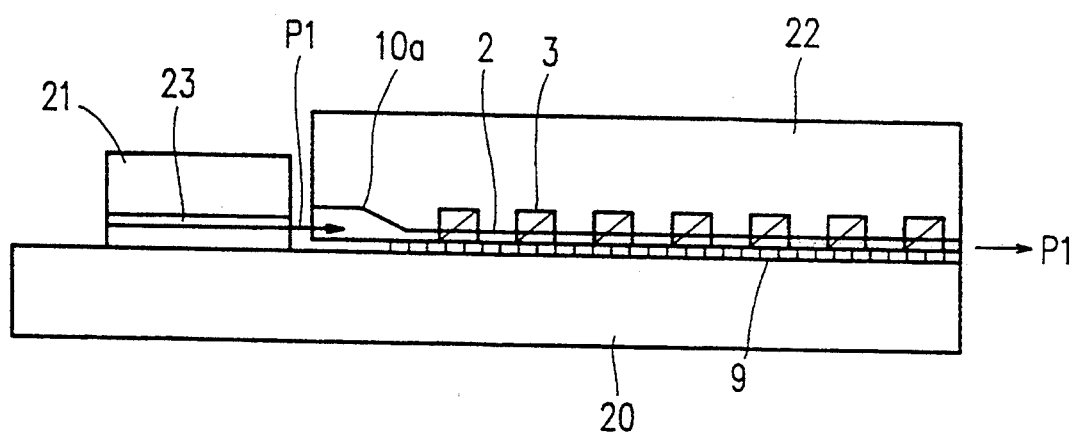
FIG. 5 is a diagram showing the construction of a short-wavelength laser light source according to a second embodiment of the invention.

FIG. 5 shows the construction of the short-wavelength laser light source according to the second embodiment. The short-wavelength laser light source of this embodiment consists essentially of an Si submount 20, a semiconductor laser 21, and a substrate 22 in which an optical waveguide is formed. A grating 9 made of $Ta_2O_5$ is formed on the optical waveguide 2 of the light-wavelength converting device 22. The fundamental wave P1 emitted from the semiconductor laser 21 fixed to the Si mount 20 is directly introduced into the optical waveguide 2, since an active layer 23 of the semiconductor laser 21 on the Si submount 20 is aligned with the optical waveguide 2. The semiconductor laser is supplied with a high frequency of 800 MHz. The light P1 introduced into the optical waveguide 2 is partly reflected by the grating and fed back into the semiconductor laser. As a result, the oscillation of the semiconductor laser is locked at the wavelength determined by the pitch of the grating and the refractive index of the substrate.

The optical waveguide 2 was formed by proton exchange in pyrophosphorous acid. The following describes how the optical waveguide and the grating are formed on the substrate. After Ta is sputtered to a thickness of 20 nm on the $LiTaO_3$ substrate 1a, the Ta is patterned using ordinary photolithography and dry etching. Next, after proton exchange, heat treatment is performed at 550° C. to form polarization inversion layers in a periodic pattern. Next, another Ta pattern is formed. To form an incident taper, a portion of the $LiTaO_3$ substrate with the Ta pattern formed thereon is immersed in a pyrophosphorous acid at 260° C. for 30 minutes for proton exchange, as a result of which a 1.2-$\mu$m thick proton exchange layer that will subsequently be formed as the incidence taper is formed directly below the slit. After that, heat treatment is performed at 420° C. for 20 minutes. The result is the formation of the incident taper of 5-$\mu$m thickness. Further, proton exchange is performed for 12 minutes in a pyrophosphorous acid at 260° C., to form a 0.5-$\mu$m thick proton exchange layer directly below the slit, which is followed by heat treatment at 420° C. for one minute. Next, a $Ta_2O_5$ film 6 is formed to a thickness of 30 nm. Next, the $Ta_2O_5$ film is formed into a periodic pattern by photolithography and dry etching. The grating 9 is thus formed. The grating interval is 1.9 $\mu$m which is 10 times the first-order cycle of 0.19 $\mu$m. Any grating interval that is an integer multiple of the first-order cycle can be used. After that, a $SiO_2$ film 5 is sputtered to a thickness of 2 $\mu$m to form a protective film. By adjusting this thickness, the height is aligned with that of the active layer of the semiconductor laser. Finally, incident and emergent faces are formed by polishing. The optical waveguide 2 is 1.9 μm in thickness and 6 mm in length. The reflectance of the grating is 10%. With this amount of reflection, sufficient wavelength stabilization can be achieved. It was also found that when reflectance was set within the range of 0.5 to 2.5% when coating the entire surfaces of the semiconductor laser, stable wavelength locking was achieved. When the spacing between the semiconductor laser and the grating was set at 9 mm or more, the wavelength locking could not be maintained when the reflectance of the grating was set at 10%. Stable operation can therefore be achieved when the spacing is set at less than 9 mm.

Next, the semiconductor laser 21 with the active layer side facing down is bonded to the Si submount 20 of 8 mm in length. Then, leads are attached to the semiconductor laser, and while causing the semiconductor laser to emit light, the light-wavelength converting device 22 with the optical waveguide formed therein is glued to a position where the light P1 emerging from the optical waveguide is the greatest. With the above processing steps, a compact laser light source can be fabricated.

The harmonic output power of the thus fabricated short-wavelength laser light source was 10 mW, while the output of the semiconductor laser was 60 mW. The laser light source of the invention did not cause any variation in output, and exhibited a very stable operation.

Embodiment 3

A third embodiment of the laser light source of the invention will be described below.

Figure 6A:
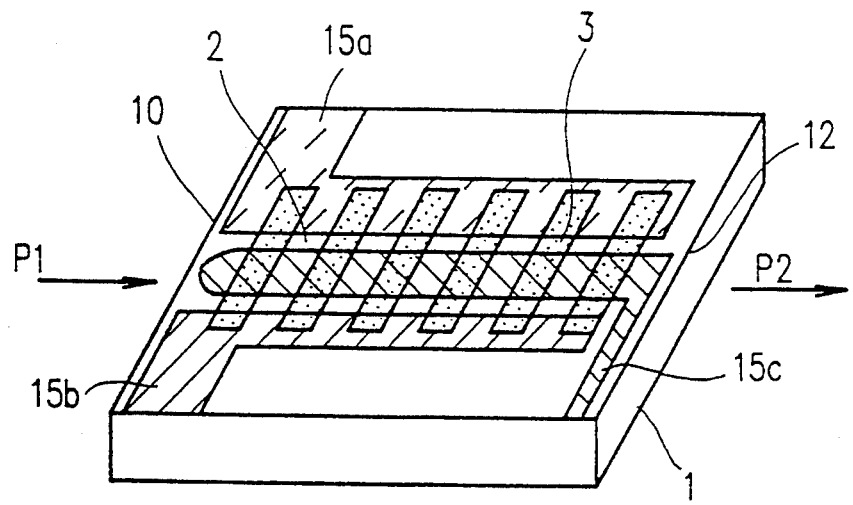
FIG. 6A is a perspective view showing the construction of a light-wavelength converting device according to a third embodiment of the invention.
Figure 6B:
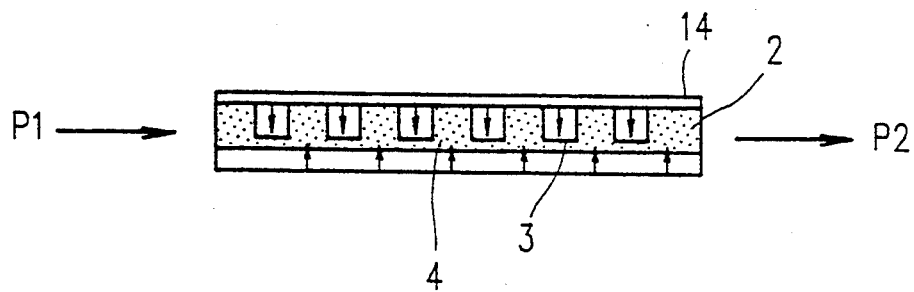
FIG. 6B is a cross-sectional view showing the construction of the light-wavelength converting device according to the third embodiment of the invention.
Figure 6C:
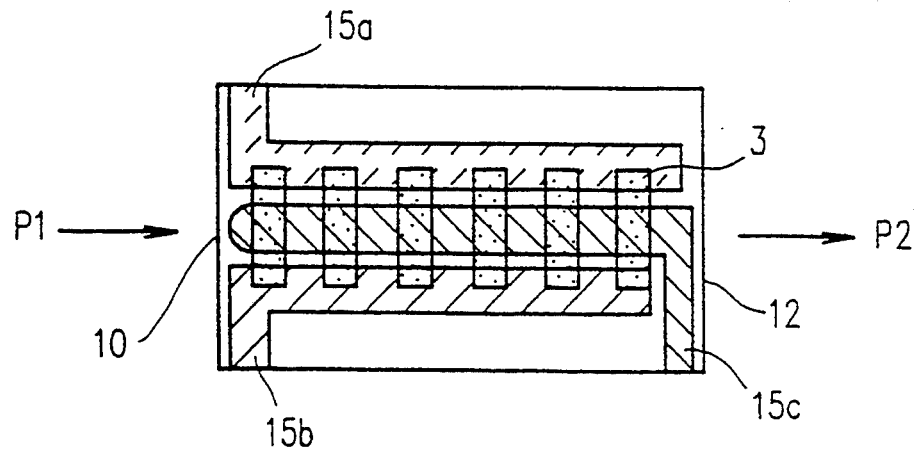
FIG. 6C is a top plan view showing the construction of the light-wavelength converting device according to the third embodiment of the invention.

FIGS. 6A, 6B and 6C show the construction of the short-wavelength laser light source according to the third embodiment of the invention. In this embodiment, a proton exchange optical waveguide 2 formed in a LiNbO$_3$ substrate 1 by proton exchange is used as the optical waveguide for the short-wavelength laser light source. In FIG. 6A, the numeral i is a +Z plate of the LiNbO$_3$ substrate (+side of the substrate cut along a direction perpendicular to the Z axis), 2 is the optical waveguide formed therein, 3 is a grating formed from polarization inversion layers, 10 is an incident face on which light P1 is incident, 12 is an emergent face from which light P1 emerges, and 15 are Al electrodes formed on the optical waveguide. LiNbO$_3$ exhibits a large electro-optic effect, and its refractive index can be changed by adjusting the applied electric field. By forming the optical waveguide close to the cutoff thickness, switching or modulation is possible. That is, by varying the voltage applied to the optical waveguide, its refractive index is reduced, and the optical waveguide is put in a cutoff mode so that the beam cannot be propagated through it. With the optical waveguide grounded at one side, when a positive voltage is applied to the optical waveguide, electric lines of force are formed and an electric field is applied. As a result, the refractive index of the optical waveguide is reduced, so that the guided wave is introduced into the substrate in a radiation mode and does not emerge from the emergent face. This accomplishes switching. The electrode width is 4 μm, the electrode spacing is 5 μm, and the thickness is 200 nm. Without the SiO$_2$ protective film, the metal electrodes 15 would directly contact the optical waveguide 2, resulting in increased propagation loss. The length of the device is 10 mm.

Figure 7A:
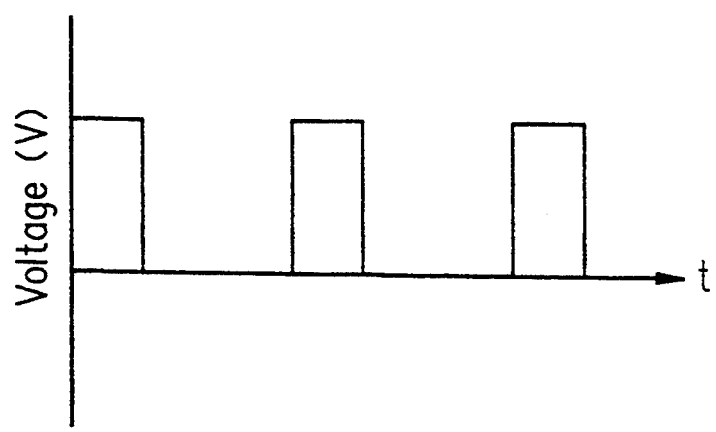
FIG. 7A is a waveform diagram of a voltage applied to the light-wavelength converting device.
Figure 7B:
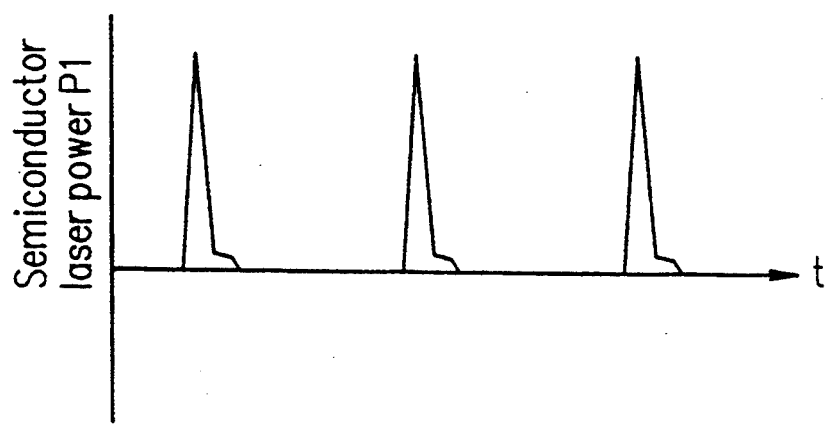
FIG. 7B is a waveform diagram of a semiconductor laser output applied to the light-wavelength converting device.

When semiconductor laser light P1 (wavelength 840 nm) as the light P1 in FIG. 6 was guided through the incident face 10, the light was propagated by a single mode and fed back by the grating 3, and the semiconductor laser operated at a stable wavelength. When a voltage of 10 V was applied to the electrodes 15, the refractive index was lowered $10^{-4}$ and the beam was cut off. The electric field strength at this time was $2 \times 10^6$ V/m. FIGS. 7A and 7B show the waveform of the applied voltage and also the waveform of the semiconductor laser output. A pulse-like modulation voltage (repetition period 1 ns) with a peak voltage of 10 V was applied to the electrodes 15. Even when a DC voltage was applied to the semiconductor laser itself, by applying a modulation voltage of 1000 MHz frequency to the electrodes 15 the output light of the semiconductor laser was pulsed. In this manner, by applying a modulation voltage to the electrodes 15, a high peak power can be obtained.

In this embodiment, LiNbO$_3$ which exhibits a large electro-optic effect is used, but other ferroelectric materials such as KTP can also be used. In multimode light propagation, the output is unstable and is not practicable; therefore, single mode propagation is more effective.

Embodiment 4

Figure 8:
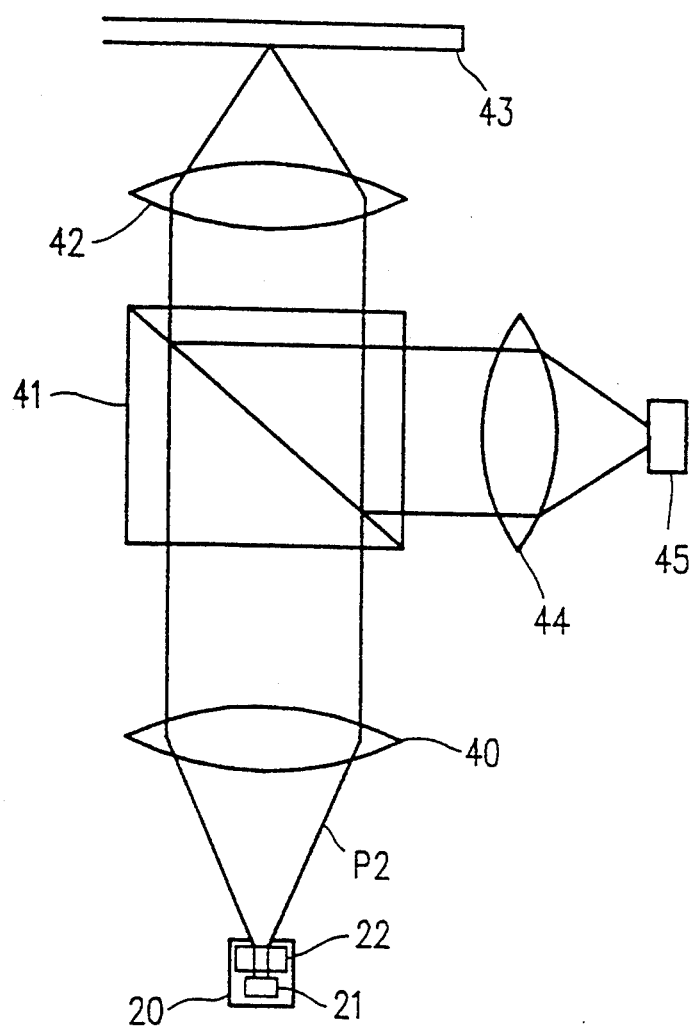
FIG. 8 is a diagram showing the construction of an optical information processing apparatus according to fourth embodiment of the invention.

An embodiment of an optical information processing apparatus implemented as a fourth embodiment of the present invention will now be described. FIG. 8 shows the construction of the optical information processing apparatus. The construction of the short-wavelength laser light source is identical to that of the second embodiment. In the present embodiment, LiNbO$_3$ is used for the substrate. Light P1 emitted from the semiconductor laser 21 driven by a high-frequency power is introduced into the optical waveguide 2 formed in the substrate 22. The introduced light P1 is propagated through the optical waveguide 2 by TM$_{00}$ mode, the lowest-order mode, and partly fed back into the semiconductor laser by the grating formed on the optical waveguide. As a result, the wavelength-converted harmonic wave P2 is emitted from the optical waveguide 2 as a laser beam. This beam is collimated by a lens 40, passed through a beam splitter 41, and focused by a lens 42 onto an optical disk 43, the recording medium. The reflected light is collimated by the lens 42, reflected by the beam splitter 41, and focused by a lens 44 onto an Si detector 45 where the signal is read. The material of the lens 42 is SF8 (refractive index 1.68), and the numerical aperture (NA) is 0.6. The focused spot size was 1.1 μm. The beam was stable, and thus, a high-density recording apparatus was achieved. The short-wavelength laser light source is compact in size, measuring at most 8 mm square. Furthermore, the light reflected from the optical disk surface was free from wavelength variations, and a good relative intensity of noise (RIN), i.e. −140 dB/Hz, can be obtained.

Lens materials of high refractive index or high dispersion type, such as SF6, may also be used since the laser wavelength is constant. Furthermore, the optical information processing apparatus of this embodiment may be constructed in other ways; for example, using a single lens or a construction using a prism is also possible.

The above embodiment uses Si as the material for the submount, but other materials having good thermal conductivity, such as Cu or C, may be used instead of Si. In the embodiment, LiNbO$_3$ or LiTaO$_3$ is used as the crystal, but instead, ferroelectric materials, such as KNbO$_3$ and KTP, and organic materials, such as MNA, may be used.

Embodiment 5

A fifth embodiment of the short-wavelength laser light source of the invention will be described below with reference to the drawings.

Figure 9:
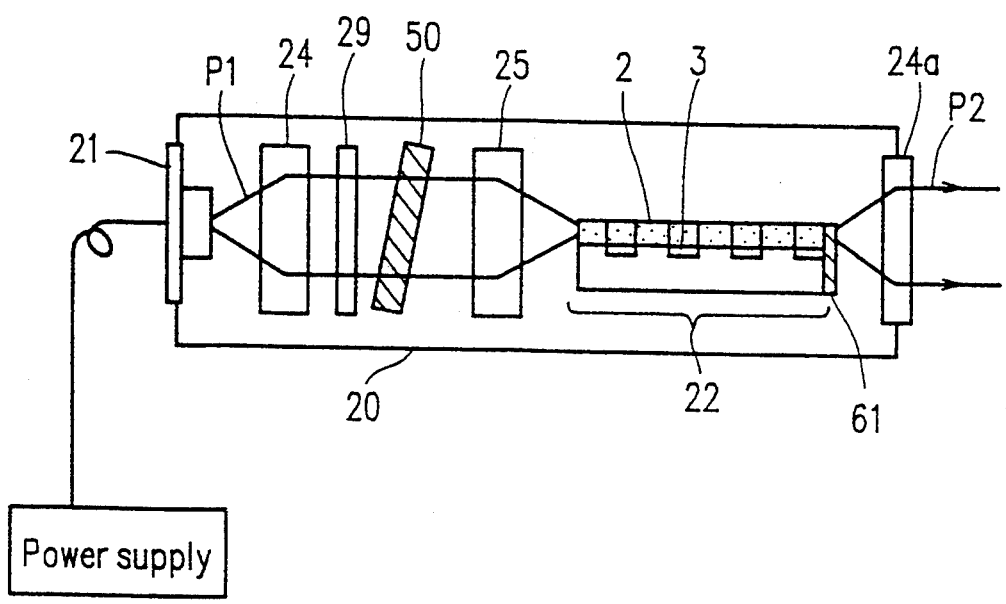
FIG. 9 is a diagram showing the construction of a short-wavelength laser light source according to a fifth embodiment of the invention.

FIG. 9 shows the construction of a blue laser light source, a type of short-wavelength laser light source, constructed using a light-wavelength converting device. In this embodiment, an optical transmitting filter is used to lock the wavelength of the semiconductor laser. The blue laser light source of this embodiment includes: an optical waveguide 2; a light-wavelength converting device 22 formed from a substrate having a nonlinear optical effect and having polarization inversion layers 3 formed in a periodic pattern; a semiconductor laser 21; and a high-frequency power supply for driving the semiconductor laser 21. In fabrication, the light-wavelength converting device 22 was first bonded to a mount 20, and then a focusing lens 25 with an NA of 0.5 and a half-wave plate 29 were inserted in the mount 20 and fixed in place. Next, a collimator lens 24 with an NA of 0.4 and the semiconductor laser 21 were inserted, and while driving the semiconductor laser 21, the collimator lens 24 and the semiconductor laser 21 were moved so that the fundamental wave P1 was focused on an incident face 10 of the light-wavelength converting device 22 to maximize the emergent harmonic wave output P2, and were then fixed in place. A wavelength selective mirror 61 designed to reflect the fundamental wave P1 but transmit the harmonic wave P2 was formed by deposition on the emergent face of the optical waveguide 2. Next, an optical transmitting filter 50 with a wavelength width of 0.6 nm was mounted in position.

Figure 10:
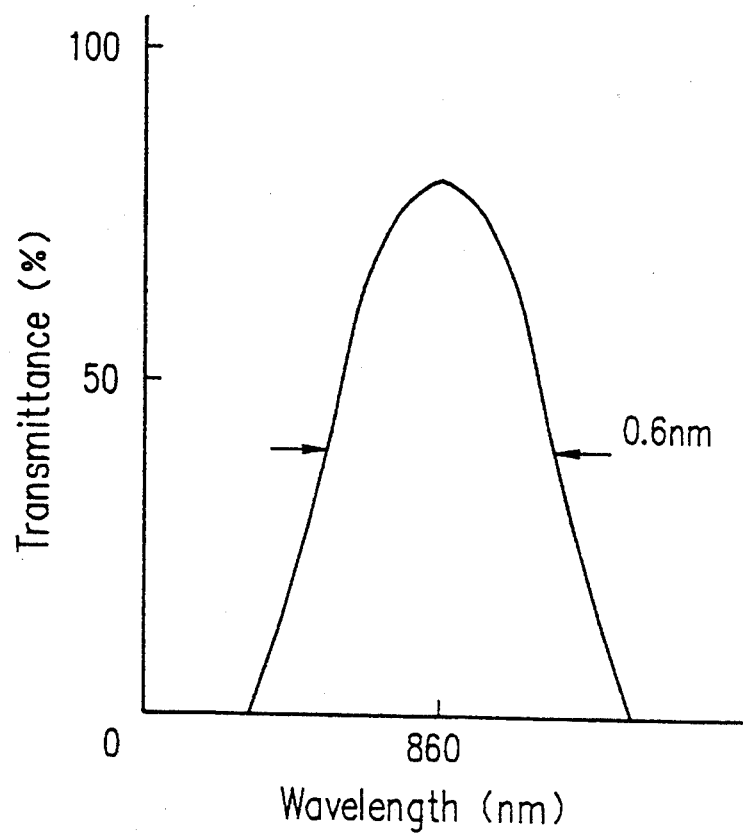
FIG. 10 is a transmittance characteristic diagram of an optical transmitting filter.

The transmittance characteristic of the optical transmitting filter 50 is shown in FIG. 10. The transmitting filter is installed at an angle of 80 degrees with respect to the fundamental wave. If it were installed at exactly 90 degrees, reflected light would occur. As shown, a transmittance of more than 80% was obtained at the peak. The transmitted wavelength has a half-value width of 0.6 nm on both sides of the center wavelength of 860 nm. The specific wavelength of the fundamental wave thus transmitted is reflected by the emergent face of the optical waveguide, propagated by the same path in the opposite direction, and fed back to the semiconductor laser, thus accomplishing wavelength locking.

In FIG. 9, the semiconductor laser 21 operates at an oscillation wavelength of 860 nm, and emits a fundamental wave P1 with an average power of 50 mW by being supplied with a constant current (hereinafter called the DC bias) from a CW power supply and a sinusoidal high-frequency wave (600 MHz) from the high-frequency power supply. This fundamental wave P1 is passed through the lenses 24, 25 and half-wave plate 29, and introduced into the light-wavelength converting device 22 to generate the harmonic wave P2. The half-wave plate 29 is inserted in order to make the direction of polarization of the semiconductor laser 21 coincide with that of the optical waveguide 2 formed in the light-wavelength converting device 22 of 10-mm length. With this light-wavelength converting device 22, when a fundamental wave P1 of 40 mW was introduced into the optical waveguide 2, a harmonic output of 10 mW was obtained, the total conversion efficiency being 25%. The stability of the harmonic output was within ±1%. The angular alignment of the transmitting filter is very easy as it allows about 30 times greater tolerance than the alignment of the grating. Furthermore, since the film can be formed by deposition, it lends itself to volume production.

In operation, the semiconductor laser 21 is not fast enough to respond to the change of the electrical waveform (a), and produces sudden pulses with the relaxation oscillations. At this time, the peak output of the semiconductor laser 21 is about 1 W, and the harmonic conversion efficiency is higher than 20%. In this case, the average power of the semiconductor laser 21 is 50 mW, which does not cause a reliability problem. In this embodiment, the distance between the emergent face of the semiconductor laser and the reflecting face is 15 mm. With this distance, stable wavelength locking was achieved. At a distance of 16 mm or greater, wavelength locking was unstable. In this embodiment, the reflectance of the semiconductor laser at the emergent face is 2%. In the experiment conducted, stable locking was achieved with a reflectance of 2.5% or less. However, when the reflectance was set at 0.5% or less, the semiconductor laser did not oscillate and it was difficult to achieve alignment.

In the present embodiment, the emergent face of the optical waveguide is used as the reflecting face, but instead, the incident face thereof may be used as the reflecting face. In the latter case, locking was achieved when the reflectance was set at 3% or over. Because of the confocal arrangement, light is fed back into the semiconductor laser if introduced into the optical waveguide.

When high-frequency driving was employed to drive the semiconductor laser, we were able to suppress the variation of the harmonic output within ±1%. This is because oscillation occurs stably at a single wavelength since light is fed back to the semiconductor laser 21 by the transmitting filter and reflecting face, despite the oscillation wavelength of the semiconductor laser 21 tending to spread by high-frequency driving.

Embodiment 6

Next, a sixth embodiment of the short-wavelength laser light source of the invention will be described below with reference to drawing.

Figure 11:
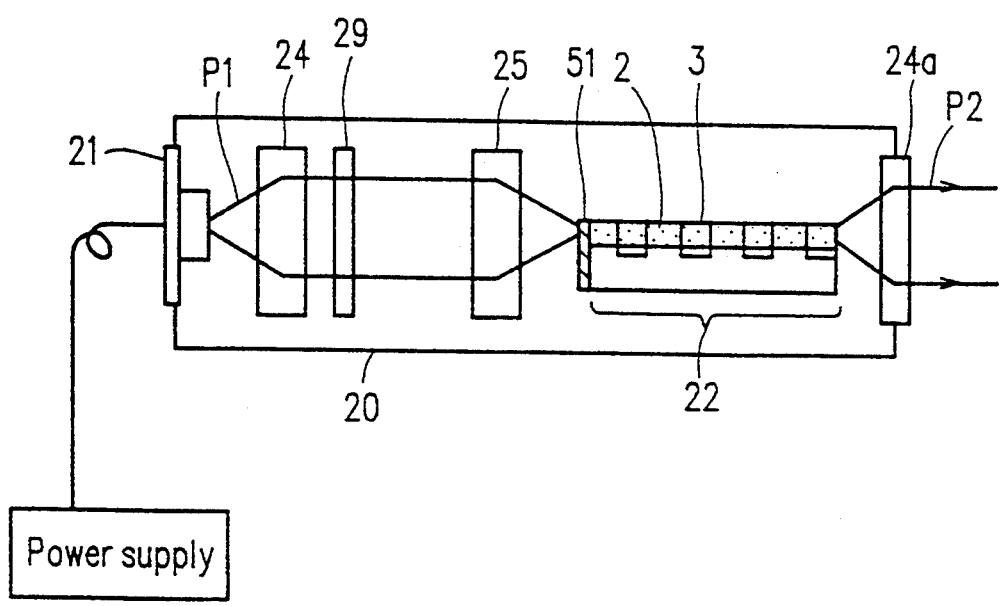
FIG. 11 is a diagram showing the construction of a light-wavelength converting device according to a sixth embodiment of the invention.
Figure 12:
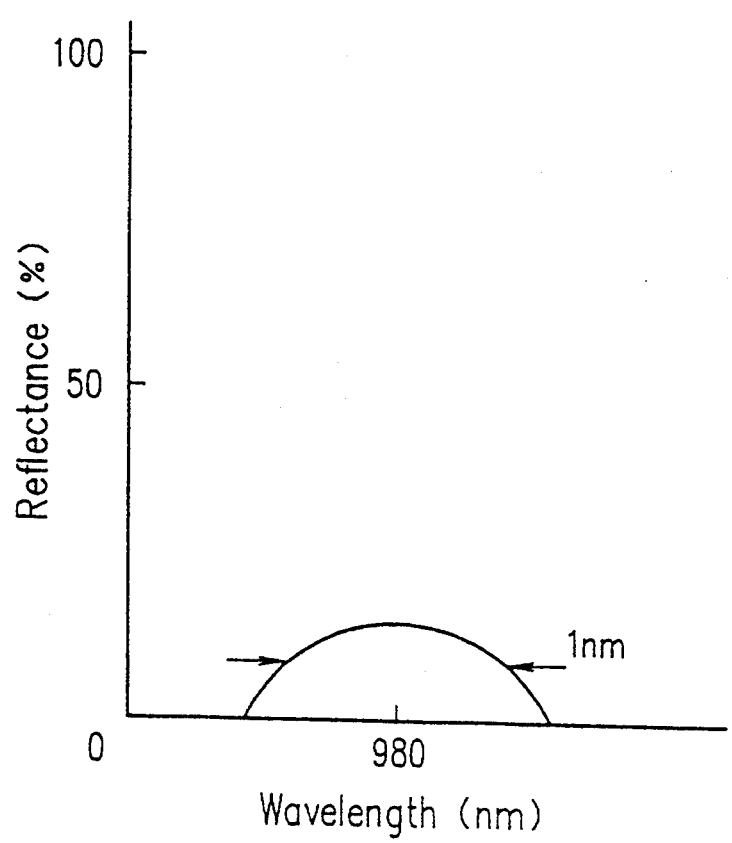
FIG. 12 is a reflectance characteristic diagram of a reflecting mirror.
Figure 13:
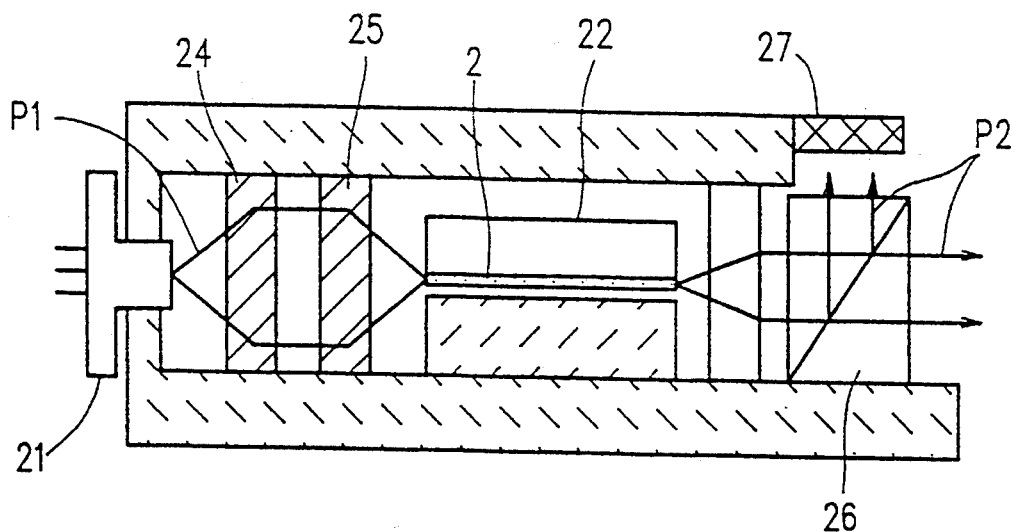
FIG. 13 is a diagram showing the construction of a short-wavelength laser light source according to the prior art.
Figure 14:
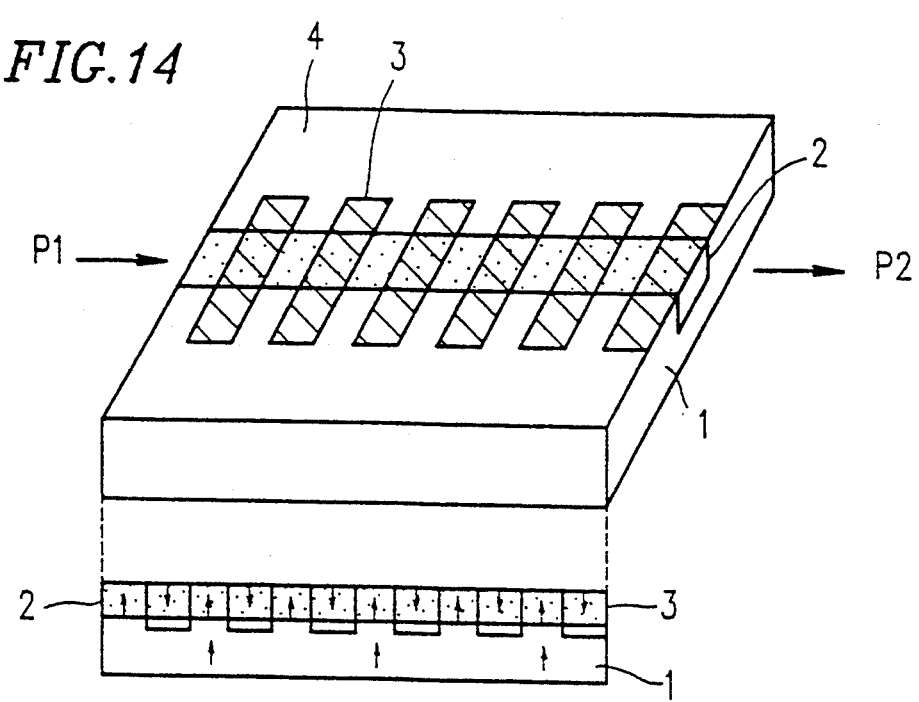
FIG. 14 is a diagram showing the construction of a light-wavelength converting device according to the prior art.
Figure 15:
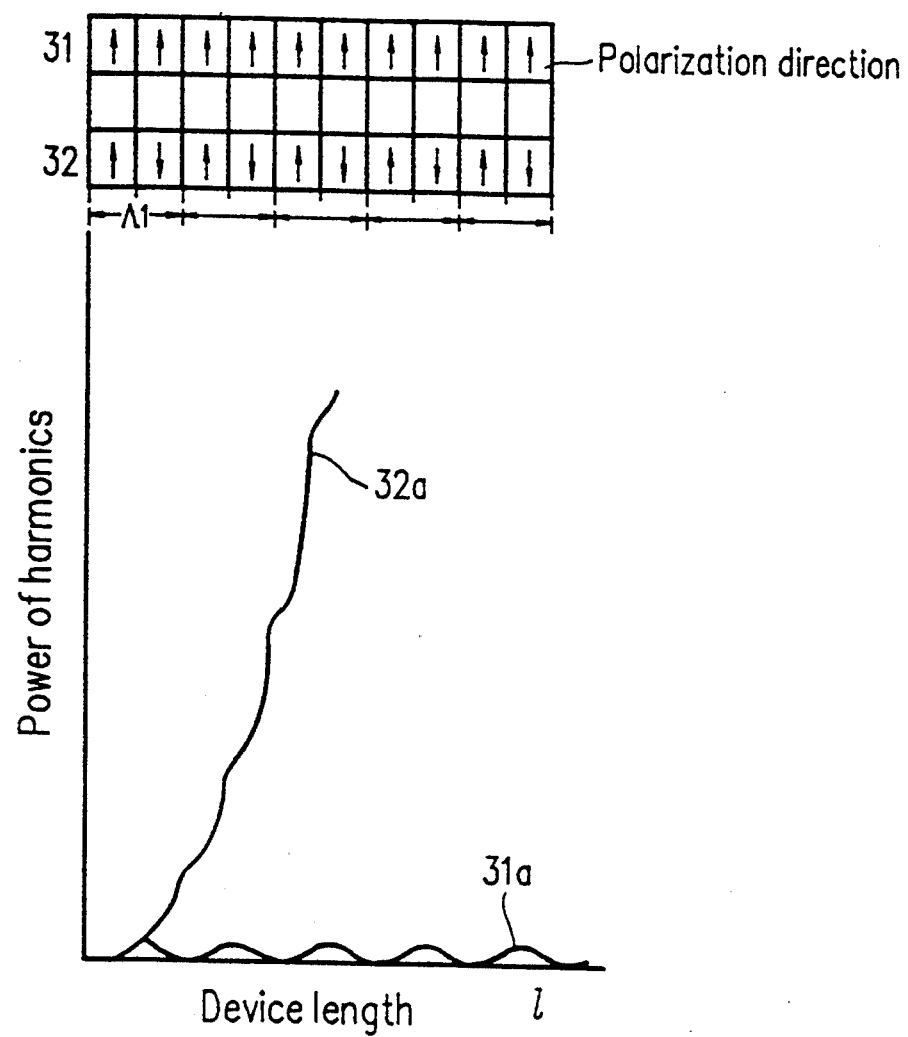
FIG. 15 is a diagram showing the principle of light wavelength conversion.

FIG. 11 shows the construction of a blue laser light source, a kind of short-wavelength laser light source, constructed using a light-wavelength converting device. In this embodiment, a reflecting mirror that reflects a fundamental wave of a specific wavelength is used to lock the wavelength of the semiconductor laser. The blue laser light source of this embodiment includes: an optical waveguide 2; a light-wavelength converting device 22 formed from a substrate having a nonlinear optical effect and having polarization inversion layers 3 formed in a periodic pattern; a semiconductor laser 21; and a high-frequency power supply for driving the semiconductor laser 21. In this embodiment, a high-frequency module is used to apply a high-frequency power. The module whose output power is 10 dBm is installed in close proximity to the semiconductor laser. In FIG. 11, the semiconductor laser 21 operates at an oscillation wavelength of 980 nm, and emits a fundamental wave P1 with an average power of 50 mW by being supplied with a constant current (hereinafter called the DC bias) from a CW power supply and a sinusoidal high-frequency wave (600 MHz) from the high-frequency module. This fundamental wave P1 is passed through the lenses 24, 25 and half-wave plate 29, and introduced into the light-wavelength converting device 22 for generation of the harmonic wave P2. The half-wave plate 29 is inserted in order to make the direction of polarization of the semiconductor laser 21 coincide with that of the optical waveguide 2 formed in the light-wavelength converting device 22 of 20-mm length. The fundamental wave from the semiconductor laser is partly reflected by the reflecting mirror 51 to lock the wavelength of the semiconductor laser. The reflectance characteristic of this reflecting mirror is shown in FIG. 12. As shown, it has a peak at 980 nm where the reflectance is 15%. The semiconductor laser is thus locked to this reflected wavelength. With this light-wavelength converting device 22, when a fundamental wave P1 of 30 mW was fed into the optical waveguide 2, a harmonic output of 10 mW was obtained, the total conversion efficiency being 33%. The stability of the harmonic output was within ±1%. In operation, the semiconductor laser 21 is not fast enough to respond to the change of the electrical waveform (a), and produces sudden pulses with relaxation oscillations. At this time, the peak output of the semiconductor laser 21 is about 500 mW, and the harmonic conversion efficiency is much higher than that obtained in CW operation. In this case, the average power of the semiconductor laser 21 is 50 mW, which does not cause a reliability problem. It is desirable that the reflectance of the reflecting mirror be set within a range of 3 to 20%. With a larger reflectance, the output that can be used for conversion would be reduced, and with a smaller reflectance, wavelength locking could not be achieved.

If the optical path length is determined so that light pulses are fed back to the semiconductor laser in synchronism with the driving pulse interval, a particularly large fundamental pulse wave power can be obtained, and as a result, the harmonic output increases. More specifically, when the pulse interval is 1 ns, if the round trip optical path length is set at 33 cm, the time it takes for the emitted fundamental wave to be fed back to the semiconductor laser is 1 ns which is equal to the pulse interval.

Embodiment 7

Figure 16:
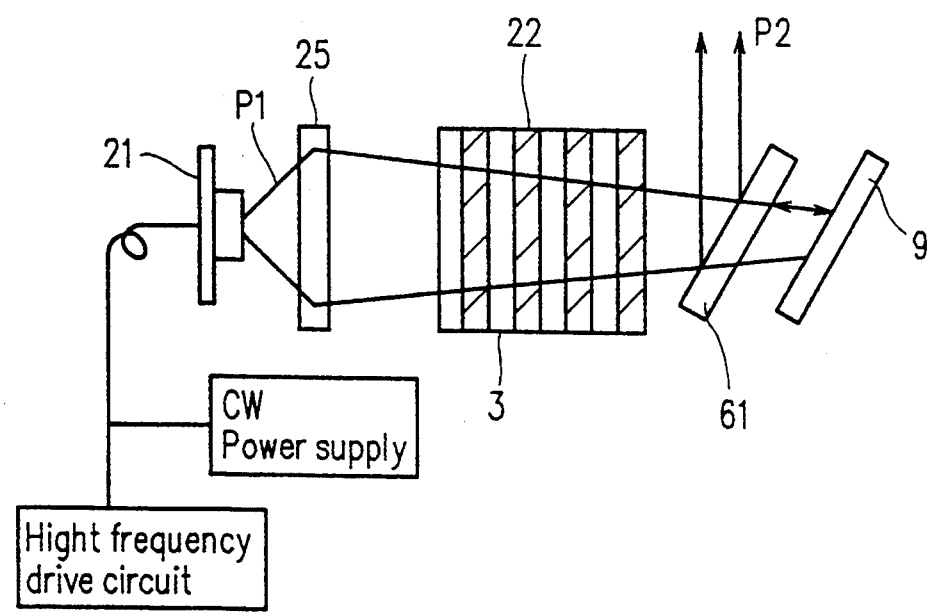
FIG. 16 is a diagram showing the construction of a short-wavelength light source according to a seventh embodiment of the invention.

A seventh embodiment of the short-wavelength laser light source of the invention will be described below with reference to drawing. FIG. 16 shows the construction of a blue laser light source, a kind of short-wavelength laser light source, constructed using a light-wavelength converting device. The blue laser light source of this embodiment includes: a light-wavelength converting device 22 formed from a bulk-like $LiTaO_3$ substrate having a nonlinear optical effect and having polarization inversion layers 3 formed in a periodic pattern; a semiconductor laser 21; and a high-frequency power supply for driving the semiconductor laser 21. The semiconductor laser 21 operates at an oscillation wavelength of 0.86 μm, and emits a fundamental wave P1 with an average power of 600 mW by being supplied with a constant current (hereinafter called the DC bias) from a CW power supply and a sinusoidal high-frequency wave (0.9 GHz) from the high-frequency power supply. This fundamental wave P1 is passed through a lens 25 and introduced into the light-wavelength converting device 22 for generation of the harmonic wave P2. In the light-wavelength converting device 22 of 6 mm length, the polarization inversion layers 3 are formed in a periodic pattern at 3.6 μm pitch. The fundamental wave P1 is passed through the light-wavelength converting device 22, and then transmitted through a wavelength selective mirror 61, and the primary diffracted light from a grating 9 is fed back to the semiconductor laser 21. The harmonic wave P2, i.e. the generated blue light, is reflected by the wavelength selective mirror 61 for output. When a fundamental wave P1 of 500 mW power was introduced into the light-wavelength converting device 22, a harmonic output of 10 mW was obtained, achieving a conversion efficiency of 2%. The stability of the harmonic wave was within ±2%. The power of the harmonic output after conversion was increased by a factor of 30 compared with that obtained in CW operation. The present embodiment thus demonstrates that a bulk-type polarization inversion device that is easy to align can be used as the light-wavelength converting device.

As described, according to the short-wavelength laser light source of the invention, the semiconductor laser is driven by a high-frequency power to increase the peak power of the laser light, thereby increasing the efficiency of harmonic conversion through the light-wavelength converting device having polarization inversion layers. The effect of this is a drastic increase in the harmonic output power. Since laser light of stable wavelength can be obtained by feedback from the grating, stable wavelength conversion can be accomplished.

Furthermore, since high-frequency driving is employed to drive the semiconductor laser that generates the fundamental wave, the construction is resistant to light reflected into the semiconductor laser, which ensures a stable harmonic output.

According to the invention, the above construction can also be achieved by using an optical transmitting filter or a reflecting mirror. As in the construction using the grating, the semiconductor laser can be locked in the pulsed state by high-frequency driving, achieving a higher output power and increased stability. Moreover, the transmitting filter and reflecting mirror are easy to align angularly and also advantageous to industrial use as compared with the grating.

Furthermore, according to the laser light source of the invention, by controlling the voltage applied to the optical waveguide the feedback of the fundamental wave is modulated, and a high peak output can be obtained momentarily. This also makes it possible to increase the average power of the harmonic output.

For an optical information processing apparatus incorporating the above short-wavelength laser light source, the recording density is increased drastically since it can make use of the short-wavelength light of high stable output. Furthermore, by using a laser light source of stable wavelength in the optical processing information apparatus of the invention, a spot free from aberration can be easily obtained and is stable with resistance to reflected light from the recording medium also increased. This offers enormous practical advantages.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A short-wavelength laser light source comprising:

at least one semiconductor laser for emitting laser light;

a power supply for driving the semiconductor laser and thereby causing the semiconductor laser to emit a fundamental wave;

a polarization inversion-type light-wavelength converting device for generating from the fundamental wave a harmonic wave having a shorter wavelength than the fundamental wave; and laser light feedback means for feeding light of the fundamental wave lying in a selected wavelength region back to the semiconductor laser, thereby achieving oscillation wavelength locking, wherein the power supply supplies to the semiconductor laser a high-frequency power containing AC components oscillating in a cycle short enough to cause the semiconductor laser to emit the fundamental wave in the form of pulsed laser light.

2. A short-wavelength laser light source according to claim 1, wherein the pulse duration of the pulsed laser light is less than or equal to one-tenth of the cycle.

3. A short-wavelength laser light source according to claim 2, wherein the high-frequency power is 500 megahertz or higher in frequency.

4. A short-wavelength laser light source according to claim 1, wherein the high-frequency power is 1 W or larger in power.

5. A short-wavelength laser light source according to claim 1, wherein the light-wavelength converting device comprises
a substrate having a nonlinear optical effect, and
a polarization inversion layer formed in the substrate.

6. A short-wavelength laser light source according to claim 5, wherein the substrate having a nonlinear optical effect is an $LiNb_xTa_{1-x}O_3$ substrate $0 \leq x \leq 1$.

7. A short-wavelength laser light source according to claim 1, wherein the light-wavelength converting device comprises
a substrate having a nonlinear optical effect,
an optical waveguide, formed in the substrate, for guiding laser light, and
a polarization inversion layer formed in the substrate.

8. A short-wavelength laser light source according to claim 7, wherein the substrate having a nonlinear optical effect is an $LiNb_xTa_{1-x}O_3$ substrate $0 \leq x \leq 1$.

9. A short-wavelength laser light source according to claim 7, wherein the laser light feedback means includes a grating for diffracting the light lying in the selected wavelength region in a designated direction, the grating being formed on the optical waveguide of the light-wavelength converting device.

10. A short-wavelength laser light source according to claim 9, wherein the semiconductor laser and the light-wavelength converting device are integrated on a submount and are optically coupled directly to each other.

11. A short-wavelength laser light source according to claim 1, wherein the laser light feedback means includes a grating for diffracting the light lying in the selected wavelength region in a designated direction.

12. A short-wavelength laser light source according to claim 11, wherein the spacing between the semiconductor laser and the grating is within 9 mm.

13. A short-wavelength laser light source according to claim 1, wherein the laser light feedback means includes a wavelength selective filter for transmitting the light lying in the selected wavelength region, and reflecting means for reflecting the light transmitted through the wavelength selective filter back into the semiconductor laser.

14. A short-wavelength laser light source according to claim 13, wherein the wavelength selective filter is mounted between the semiconductor laser and the light-wavelength converting device.

15. A short-wavelength laser light source according to claim 13, wherein the reflecting means is a fundamental wave incident face or harmonic wave emergent face of the light-wavelength converting device.

16. A short-wavelength laser light source according to claim 15, further comprising
a first lens for collimating the fundamental wave emitted from the semiconductor laser, and
a second lens for converging the collimated fundamental wave onto the light-wavelength converting device,
wherein the wavelength selective filter is mounted between the first lens and the second lens.

17. A short-wavelength laser light source according to claim 1, wherein the laser light feedback means is a wavelength selective reflecting mirror that reflects the light lying in the selected wavelength region.

18. A short-wavelength laser light source according to claim 17, wherein the wavelength selective reflecting mirror is mounted between the semiconductor laser and the light-wavelength converting device.

19. A short-wavelength laser light source according to claim 18, wherein the wavelength selective reflecting mirror is mounted on the light-wavelength converting device.

20. A short-wavelength laser light source according to claim 1, wherein the reflectance at an end of the semiconductor laser from which the fundamental wave emerges is within a range of 0.5 to 2.5%.

21. A short-wavelength laser light source comprising:
at least one semiconductor laser for emitting laser light;
a DC power supply for driving the semiconductor laser and thereby causing the semiconductor laser to emit a fundamental wave;
a polarization inversion-type light-wavelength converting device for generating from the fundamental wave a harmonic wave having a shorter wavelength than the fundamental wave; and
laser light feedback means for feeding light of the fundamental wave lying in a selected wavelength region back to the semiconductor laser, thereby achieving oscillation wavelength locking,
wherein the light-wavelength converting device comprises:
a substrate having a nonlinear optical effect;
an optical waveguide, formed in the substrate, for guiding laser light;
a polarization inversion layer formed in the substrate; and
a modulation electrode, formed on the optical waveguide, for controlling the propagation of the laser light,
the modulation electrode receiving pulse-like modulation voltage to modulate the feedback to the semiconductor laser of the light lying in the selected wavelength region.

22. A short-wavelength laser light source according to claim 21, wherein the laser light feedback means includes a grating for diffracting the light lying in the selected wavelength region in a designated direction, the grating being formed on the optical waveguide of the light-wavelength converting device.

23. An optical information processing apparatus comprising:
- a short-wavelength laser light source which includes at least one semiconductor laser for emitting laser light,
- a power supply for driving the semiconductor laser and thereby causing the semiconductor laser to emit a fundamental wave,
- a polarization inversion-type light-wavelength converting device for generating from the fundamental wave a harmonic wave having a shorter wavelength than the fundamental wave, and
- laser light feedback means for feeding light of the fundamental wave lying in a selected wavelength region back to the semiconductor laser, thereby achieving oscillation wavelength locking;
- optical means for directing the harmonic wave emitted from the short-wavelength laser light source onto an optical information recording medium; and
- an optical detector for detecting the harmonic wave reflected from the optical information recording medium,
- wherein the power supply supplies to the semiconductor laser a high-frequency power containing AC components oscillating in a cycle short enough to cause the semiconductor laser to emit the fundamental wave in the form of pulsed laser light.

24. An optical information processing apparatus according to claim 23, wherein the high-frequency power has a frequency of 500 megahertz or higher.

* * * * *